United States Patent [19]

Sueyoshi et al.

[11] 4,356,454
[45] Oct. 26, 1982

[54] EQUALIZER AMPLIFIER

[75] Inventors: Susumu Sueyoshi; Kikuo Ishikawa, both of Tokyo, Japan

[73] Assignee: Pioneer Electronic Corporation, Tokyo, Japan

[21] Appl. No.: 187,892

[22] Filed: Sep. 17, 1980

[30] Foreign Application Priority Data

Sep. 21, 1979 [JP] Japan .................. 54/121650

[51] Int. Cl.³ .................. H03F 3/04; H03F 3/191; H03H 5/00
[52] U.S. Cl. .................. 330/294; 330/304; 330/288; 333/28 R
[58] Field of Search .................. 330/94, 288, 294, 304, 330/311; 333/28 R, 28 T

[56] References Cited

U.S. PATENT DOCUMENTS 4,071,782  1/1978  Vidovic .................. 333/28 R

Primary Examiner—James B. Mullins
Assistant Examiner—Gene Wan
Attorney, Agent, or Firm—Sughrue, Mion, Zinn, Macpeak & Seas

[57] ABSTRACT

An equalizer amplifier in which non-linear distortion is substantially eliminated. An input signal is applied to the base of a first transistor the output of which is applied to the base of a second transistor of the opposite conductivity type to the first transistor. Currents are supplied to the first and second transistors in a constant ration. The output from the circuit is provided in response to current flowing in one of the first and second transistors. At least one of the amplifier gain determining elements has a reactance component which varies depending on frequency.

8 Claims, 3 Drawing Figures

EQUALIZER AMPLIFIER

BACKGROUND OF THE INVENTION

The present invention relates to equalizer amplifiers. More particularly, the invention relates to an equalizer amplifier utilizing transistor elements.

An equalizer amplifier is essential in applications such as for the recording and reproducing (playback) circuit of a tape recorder. As the sensitivity in high frequency ranges is lowered because of various losses in the magnetic tape and the magnetic head, the provision of an equalizer amplifier is necessary to make the frequency response of the tape recorder substantially flat. Such an equalizer amplifier is designed to have a predetermined amplification factor in a low frequency range. For this purpose, the equalizer amplifier employs transistors as amplifying elements.

The input and output characteristics of a transistor are somewhat non-linear and therefore the output signal from a transistor includes distortion components. Accordingly, heretofore it has been difficult to provide an equalizer amplifier having essentially distortion-free characteristics.

Accordingly, an object of the present invention is to provide an equalizer amplifier in which non-linear distortion due to the use of transistors is eliminated thus providing distortion-free characteristics.

SUMMARY OF THE INVENTION

In an equalizer amplifier according to the invention, a first transistor, to the base of which an input signal is applied and a second transistor of opposite conductivity type to the first transistor are provided. The output of the first transistor is applied to the base of the second transistor and currents in a constant ratio are applied to the first and second transistors and an output is provided in response to current flowing in the first or second transistors. At least one of the amplifier gain determining impedance elements coupled between the first and second transistors and ground has a reactance component which varies depending on frequency.

DESCRIPTION OF THE PREFERRED EMBODIMENTS

The invention will be described with reference to the accompanying drawings.

Figure 1:
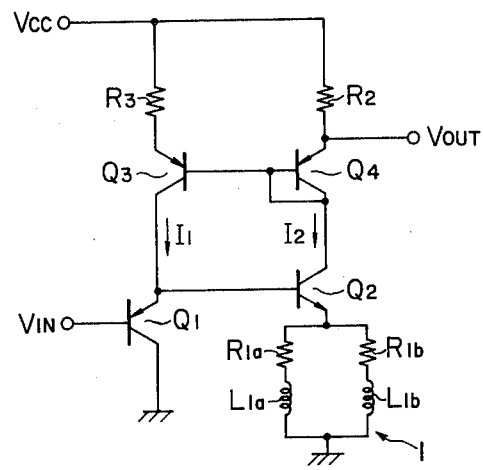
FIG. 1 is a circuit diagram of a first embodiment of an equalizer amplifier constructed according to the invention.

FIG. 1 is a diagram for a description of a preferred embodiment of an equalizer amplifier constructed according to the invention. An input signal $V_{IN}$ is applied to the base of a PNP transistor $Q_1$ forming an emitter follower circuit the emitter follower output of which is applied to the base of an amplifying NPN transistor $Q_2$. The emitter of the transistor $Q_2$ is grounded through an equalizer element 1. By way of example, a current mirror circuit is provided for supplying currents $I_1$ and $I_2$ to the transistors $Q_1$ and $Q_2$ with the ratio $I_1/I_2$ being constant ($I_1/I_2 = 1/\alpha$, where $\alpha$ is a constant). The current mirror circuit is constituted by PNP transistors $Q_3$ and $Q_4$ the bases of which are connected together as shown in FIG. 1. The base and collector of the transistor $Q_4$ are connected together; that is, the transistor $Q_4$ is diode-connected. The emitter of the transistor $Q_3$ is connected through a resistor $R_3$ to a positive voltage source Vcc and the emitter of the transistor $Q_4$ is connected through a resistor $R_2$ to the positive voltage source Vcc. The equalizer element 1, as shown in FIG. 1, is composed of a series circuit of a resistor $R_{1a}$ and a coil $L_{1a}$ connected in parallel with a series circuit of a resistor $R_{1b}$ and a coil $L_{1b}$. In this embodiment, an output $V_{OUT}$ is provided at the emitter of the transistor $Q_4$.

In the amplifier circuit thus constructed, the following equation (1) is established:

$$I_2 = (V_{IN} + V_{BE1} - V_{BE2})/Z_1, \tag{1}$$

where $V_{BE1}$ and $V_{BE2}$ are the base-collector voltages of the transistors $Q_1$ and $Q_2$, respectively, and Z is the impedance of the equalizer element 1.

In general, the relation between the collector current $I_C$ and the base-emitter voltage of a transistor can be expressed by the following equation (2):

$$V_{BE} = (kT/q)\ln(I_C/I_S + 1), \tag{2}$$

where q is the electron charge, k is Boltzmann's constant, T is the absolute temperature, and $I_S$ is the base-emitter reverse saturation current.

From equation (2), $(V_{BE1} - V_{BE2})$ in equation (1) is:

$$V_{BE1} - V_{BE2} = k/q\{T_1\ln(I_1/I_{S1} + 1) - T_2\ln(I_2/I_{S2} + 1)\}, \tag{3}$$

where $T_1$ and $T_2$ are the base-emitter junction temperatures of the transistors $Q_1$ and $Q_2$, respectively. As the value $I_S$ is a fixed constant for each transistor, $I_{S2} = \beta I_{S1}$, where $\beta$ is a constant. If $I_S$ is very small, then $I_C/I_S \ll 1$. Therefore, the following equation (4) can be obtained:

$$V_{BE1} - V_{BE2} = k/q\{T_1\ln(I_1/I_{S1}) - T_2\ln(I_2/I_{S2})\}. \tag{4}$$

If, in equation (4), the transistor junction temperature is constant, then:

$$V_{BE1} - V_{BE2} = (kT/q)\ln(\beta/\alpha). \tag{5}$$

Equation (5) has a constant value. With the constant value represented by $\gamma$, equation (1) can be rewritten into the following equation (6):

$$I_2 = (V_{IN} + \gamma)/Z_1. \tag{6}$$

The output $V_{OUT}$ can then be expressed by the following equation (7):

$$V_{OUT} = I_2 \cdot R_2 = R_2/Z_1(V_{IN} + \gamma). \tag{7}$$

Assuming that each of the coils $L_{1a}$ and $L_{1b}$ of the equalizer element 1 has a sufficiently small reactance in the lower frequency range, as is clear from equation (7) an output having an amplification factor $R_2/R_1$ and which is independent of $V_{BE}$ in the low frequency range is obtained. That is, a distortionless output is produced. In this case, $R_1 = (R_{1a} \cdot R_{1b}/R_{1a} + R_{1b})$.

Figure 2:
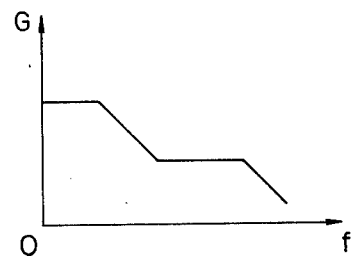
FIG. 2 is a diagram showing the gain characteristics of the equalizer amplifier of FIG. 1.

In the middle frequency range, the reactances of the coils $L_{1a}$ and $L_{1b}$ of the equalizer element 1 cannot be neglected and, accordingly, the amplification factor is gradually reduced as the frequency increases. In the high frequency range, as the reactances become higher in value than the resistances $R_{1a}$ and $R_{1b}$, the gain is reduced to a substantially constant value. A plot of the gain or amplification factor for this amplifier circuit is shown in FIG. 2.

The output may be formed other than in the way described above. If a resistor is connected between the collectors of the transistors $Q_2$ and $Q_4$, the voltage developed across the resistor may be employed as the output. Since the ratio of currents in the transistors $Q_1$ and $Q_2$ is constant, the variations in current in the transistor $Q_1$ may be utilized in the same manner. Alternatively, if the emitter of the transistor $Q_2$ is grounded through a resistor and an equalizer element constituted by a parallel circuit of a capacitor and a resistor is connected between the collectors of the transistors $Q_2$ and $Q_4$, the voltage developed across the parallel circuit may be employed as the output. In this case also, an equalizer amplifier having a frequency response equivalent to that shown in FIG. 2 is provided.

Figure 3:
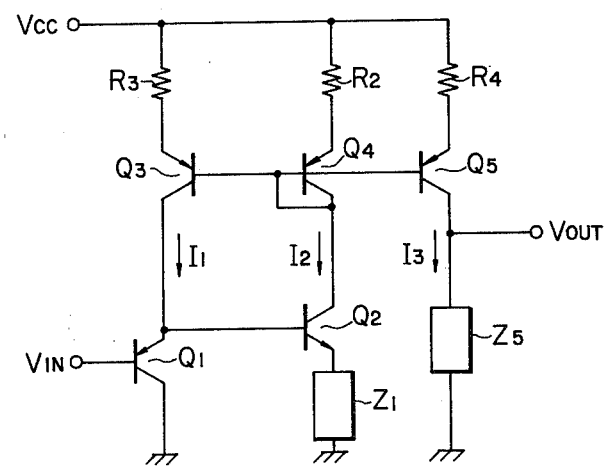
FIG. 3 is a circuit diagram of a second embodiment of an equalizer amplifier of the invention.

FIG. 3 is a circuit diagram showing an embodiment of an amplifier circuit in which the amplification factor of the circuit in FIG. 1 is further increased. In FIGS. 1 and 3, like components are designated by like reference characters.

As is apparent from a comparison of FIG. 3 with FIG. 1, a PNP transistor $Q_5$ is added to the current mirror circuit for further increasing the amplification degree. An impedance element $Z_5$ is connected between the collector of the transistor $Q_5$ and ground and a resistor $R_4$ is connected between the emitter of the transistor $Q_5$ and the positive voltage source Vcc and the voltage developed across the impedance element $Z_5$ is employed as the output. In FIG. 3, the impedance element connected to the emitter of the transistor $Q_2$ is designated by $Z_1$.

The ratio of current $I_3$ in the transistor $Q_5$ to the current $I_2$ in the transistor $Q_4$ is set to $1/\alpha'$, similar to the case of FIG. 1. The collector voltage $V_B$ of the transistor $Q_2$ is thus:

$$V_B = +Vcc - V_{BE4} - I_2 \cdot R_2. \quad (8)$$

By substituting equation (6) into equation (8):

$$V_B = +Vcc - V_{BE4} - R_2/Z_1(V_{IN} + \gamma). \quad (9)$$

The output $V_{OUT}$ in this case can be represented by the following equation (10):

$$V_{OUT} = I_3 Z_5 = Z_5/R_4 (+Vcc - V_{BE5} - V_B) \quad (10)$$

By substituting equation (9) into equation (10), the following equation (11) can be obtained:

$$V_{OUT} = Z_5/R_4 \{V_{BE4} - V_{BE5} + R_2 Z_1(V_{IN} + \gamma)\}. \quad (11)$$

As $(V_{BE4} - V_{BE5})$ can be set to a constant value $\gamma'$, equation (11) can be rewritten into the following equation (12):

$$V_{OUT} = Z_5/R_4 \{R_2/Z_1(V_{IN} + \gamma) + \gamma'\}. \quad (12)$$

Accordingly, the amplification factor is $(Z_5/R_4),(R_2/Z_1)$. Therefore, if at least one of the impedance elements $Z_1$ and $Z_5$ is employed as the equalizer element and the other is employed as the resistance element, the desired equalizer characteristic can be obtained and the output is independent of the base-emitter voltages $V_{BE}$ of the transistors. Thus, an equalizer output obtained is essentially distortion-free.

In the above-described embodiments, a current mirror circuit is employed to supply current. However, the invention is not limited thereto or thereby. That is any circuit is employed which is capable of performing the same function.

As is apparent from the above description, the equalizer amplifier according to the invention is considerably simple in arrangement and yet has the desired equalizer characteristic and amplification factor thus providing an output having a very low distortion factor.

What is claimed is:

1. An equalizer amplifier comprising:
    a first transistor to the base of which an input signal is applied;
    a second transistor to the base of which an output of said first transistor is applied, said second transistor being of the opposite conductivity type to said first transistor;
    current supplying means for supplying currents to said first and second transistors with the ratio of said currents being constant;
    output providing means for providing an output in response to variations of current which flows in one of said first and second transistors; and
    a plurality impedance elements for determining an amplification factor of said amplifier provided in the path of current flowing in at least one of said first and second transistor, at least one of said impedance elements having a reactance component which varies depending on frequency.

2. The equalizer amplifier as claimed in claim 1 in which said first transistor is connected as an emitter follower and an output of said emitter follower is applied to the base of said second transistor.

3. An equalizer amplifier comprising:
    a first transistor to the base of which an input signal is applied;
    a second transistor to the base of which an output of said first transistor is applied, said second transistor being of the opposite conductivity type to said first transistor;
    current supplying means for supplying currents to said first and second transistors with the ratio of said currents being constant;
    output providing means for providing an output in response to variations of current which flows in one of said first and second transistors; and
    a plurality of first amplfication factor determining impedance elements provided in the path of current flowing in one of said first and second transistors and a second amplification factor determining impedance element in said output providing means, at least one of said first and second amplification determining impedance elements having a reactance component which varies depending on frequency.

4. The equalizer amplifier as claimed in claim 3 in which said first transistor is connected as an emitter follower and an output of said emitter follower is applied to the base of said second transistor.

5. An equalizer amplifier comprising:
    a first PNP transistor, an input signal being applied to the base of said first PNP transistor and the collector of said first PNP transistor being coupled to ground;

a second PNP transistor, the collector of said second PNP transistor being coupled to the emitter of said first PNP transistor and the emitter of said second PNP transistor being coupled to a positive voltage terminal through a first resistor;

a third PNP transistor, the base of said third PNP transistor being coupled to the base of said second PNP transistor and to the collector of said third PNP transistor and the emitter of said third PNP transistor being coupled to said positive voltage terminal through a second resistor;

an NPN transistor, the base of said NPN transistor being coupled to said emitter of said first PNP transistor and the collector of said NPN transistor being coupled to said collector and base of said third PNP transistor; and first and second series circuits coupled in parallel with each other between the emitter of said NPN transistor and ground, the currents in said first PNP transistor and NPN transistor having a constant ratio.

6. The equalizer amplifier as claimed in claim 5 wherein each of said series circuits comprises an inductor coupled in series with a resistor, at least the inductor values being different between different series circuits.

7. An equalizer amplifier comprising:

a first PNP transistor, an input signal being applied to the base of said first PNP transistor and the collector of said first PNP transistor being coupled to ground;

a second PNP transistor, the collector of said second PNP transistor being coupled to the emitter of said first PNP transistor and the emitter of said second PNP transistor being coupled to a positive voltage terminal through a first resistor;

a third PNP transistor, the base of said third PNP transistor being coupled to the base of said second PNP transistor and to the collector of said third PNP transistor and the emitter of said third PNP transistor being coupled to said positive voltage terminal through a second resistor;

an NPN transistor, the base of said NPN transistor being coupled to the emitter of said first PNP transistor and the collector of said NPN transistor being coupled to said collector and said base of said third PNP transistor;

a first impedance element coupled between the emitter of said NPN transistor and ground, said first impedance element having a reactance component which varies depending on frequency;

a fourth PNP transistor, the base of said fourth PNP transistor being coupled to the bases of said second and third PNP transistors and the emitter of said fourth PNP transistor being coupled to said positive voltage terminal through a third resistor; and a second impedance element coupled between the collector of said fourth PNP transistor and ground, said second impedance element having a reactance component which varies depending on frequency; and the values of said resistors being selected such that the currents supplied to said first PNP transistor and said NPN transistor are in a constant ratio.

8. The equalizer amplifier as claimed in claim 7 wherein the frequency dependence of said first impedance element is different from that of said second impedance element.

* * * * *